US008766737B2

(12) United States Patent
Murata et al.

(10) Patent No.: US 8,766,737 B2
(45) Date of Patent: Jul. 1, 2014

(54) OSCILLATION DEVICE

(75) Inventors: Masaya Murata, Chiba (JP); Kotaro Watanabe, Chiba (JP); Makoto Mitani, Chiba (JP)

(73) Assignee: Seiko Instruments Inc., Chiba (JP)

( * ) Notice: Subject to any disclaimer, the term of this patent is extended or adjusted under 35 U.S.C. 154(b) by 49 days.

(21) Appl. No.: 13/612,217

(22) Filed: Sep. 12, 2012

(65) Prior Publication Data

US 2013/0082791 A1 Apr. 4, 2013

(30) Foreign Application Priority Data

Sep. 30, 2011 (JP) ................................ 2011-218244

(51) Int. Cl.
*H03L 1/02* (2006.01)
*H03B 5/04* (2006.01)

(52) U.S. Cl.
USPC ............................ 331/186; 331/176; 331/158

(58) Field of Classification Search
USPC .......................................... 331/186, 176, 158
See application file for complete search history.

(56) References Cited

U.S. PATENT DOCUMENTS

2002/0070792 A1* 6/2002 Nakamiya et al. ............ 327/535
2010/0171558 A1* 7/2010 Kim et al. ....................... 331/57

FOREIGN PATENT DOCUMENTS

JP 2008-236629 A 10/2008

* cited by examiner

*Primary Examiner* — Joseph Chang
(74) *Attorney, Agent, or Firm* — Brinks Gilson & Lione

(57) ABSTRACT

A constant voltage circuit which can realize a low consumption current, and a crystal oscillation circuit using the constant voltage circuit. The constant voltage circuit is provided with a temperature characteristic regulation element, in order to minimize a difference between a negative slope of a voltage response of a constant voltage to a temperature change and a negative slope of a voltage response of the smallest operation voltage that can oscillate in the crystal oscillation circuit to the temperature change, so that the consumption current of the crystal oscillation circuit is decreased. When the constant current generated by the constant voltage circuit is decreased, the consumption current of the constant voltage circuit is decreased, and the consumption current of the whole oscillation device is decreased.

5 Claims, 6 Drawing Sheets

(a)

(b)

(c)

OSCILLATION DEVICE

RELATED APPLICATIONS

This application claims priority under 35 U.S.C. §119 to Japanese Patent Application No. 2011-218244 filed on Sep. 30, 2011, the entire content of which is hereby incorporated by reference.

BACKGROUND OF THE INVENTION

1. Field of the Invention

The present invention relates to an oscillation device including a crystal oscillation circuit, and more particularly, it relates to a constant voltage circuit which enables a low consumption current of a crystal oscillation circuit.

2. Description of the Related Art

A conventional oscillation device is constituted of a constant voltage circuit which generates a constant voltage, and a crystal oscillation circuit which oscillates a crystal oscillator by the generated constant voltage. Such an oscillation device is broadly used in a clock, a cellular phone, a personal computer terminal or the like, whereby it is requested to suppress a consumption current.

In the oscillation device, for the purpose of suppressing the consumption current, it is important to decrease a voltage for driving the crystal oscillation circuit as much as possible. On the other hand, the crystal oscillation circuit has an oscillation stop voltage determined by oscillation characteristics of the crystal oscillator, an oscillation inverter, a load capacity and the like. It is known that the oscillation stop voltage linearly drops at a predetermined rate with a temperature rise in a usual operation temperature range (e.g., −40° C. to 85° C.). Therefore, it is necessary to set the voltage output from the constant voltage circuit so as to be higher than the oscillation stop voltage in an operation ensuring temperature range.

Here, there is known a technology in which a voltage response of the constant voltage to a temperature change is set so as to be the same as the voltage response or slope of the oscillation stop voltage to the temperature change in the operation ensuring temperature range (e.g., see Patent Document 1). FIG. 7 is a view showing a conventional constant voltage circuit. To decrease the consumption current of the crystal oscillation circuit, if a difference between the voltage response of the constant voltage to the temperature change and the voltage response of the oscillation stop voltage to the temperature change is decreased, the consumption current of the constant voltage circuit conversely increases. Therefore, when the current of a PMOS transistor MP2 and the consumption current of the constant voltage circuit are optimized, the consumption current of the whole oscillation device can be decreased as much as possible at the constant voltage of the oscillation stop voltage or more in the operation ensuring temperature range.

[Patent Document 1] JP-A-2008-236629

SUMMARY OF THE INVENTION

However, in a conventional technology, a difference between a voltage response of a constant voltage to a temperature change and a voltage response of an oscillation stop voltage to the temperature change has a tradeoff relation with a consumption current of a constant voltage circuit. Therefore, even when the consumption current of the constant voltage circuit can be decreased, a current around 100 nA is required. For example, in the conventional technology, a reference voltage circuit which generates a reference voltage by a constant current source to generate a constant current requires a consumption current of about 20 to 48 nA, and the whole constant voltage circuit requires a high consumption current of about 75 to 110 nA.

The present invention has been developed in view of the above problems, and an object is to provide a constant voltage circuit which eliminates a tradeoff relation of a difference between the slope of a voltage response of a constant voltage to a temperature change on an X-Y plot and the corresponding slope of a voltage response of an oscillation stop voltage to the temperature change with a consumption current of the constant voltage circuit and which can realize a low consumption current of several nAs, and a crystal oscillation circuit using the constant voltage circuit, so that the consumption current of the whole oscillation device is decreased.

According to the present invention, to achieve the above object, there is provided an oscillation device comprising a crystal oscillation circuit which is driven by a constant voltage output from a constant voltage circuit. The constant voltage circuit comprises a reference voltage circuit including a constant current source, and a first MOS transistor which outputs a reference voltage by a constant current of the constant current source; a differential amplification circuit which inputs the reference voltage and a feedback voltage; a second MOS transistor which outputs a constant voltage to an output terminal of the constant voltage circuit by an output of the differential amplification circuit; a temperature characteristic regulation element connected to the output terminal; and a third MOS transistor connected across the temperature characteristic regulation element and the ground to output the feedback voltage. The constant voltage generated by the constant voltage circuit has a first voltage response to a temperature change, an oscillation stop voltage of the crystal oscillation circuit has a second voltage response to the temperature change, a consumption current of the crystal oscillation circuit has a correlation with a difference between the first voltage response and the second voltage response, and the temperature characteristic regulation element regulates the first voltage response to minimize the difference between the first voltage response and the second voltage response.

In the present invention, when a constant voltage circuit is provided with a temperature characteristic regulation element, a difference between a negative voltage response of a constant voltage to a temperature change and a negative voltage response of the lowest operation voltage that can oscillate in a crystal oscillation circuit to the temperature change can be minimized, so that a consumption current of the crystal oscillation circuit can be decreased. Furthermore, when a constant current generated by the constant voltage circuit is decreased, the consumption current of the constant voltage circuit can be decreased, and the consumption current of the whole oscillation device can be decreased.

DETAILED DESCRIPTION OF THE PREFERRED EMBODIMENTS

Hereinafter, embodiments of the present invention will be described with reference to the drawings.

Figure 1:
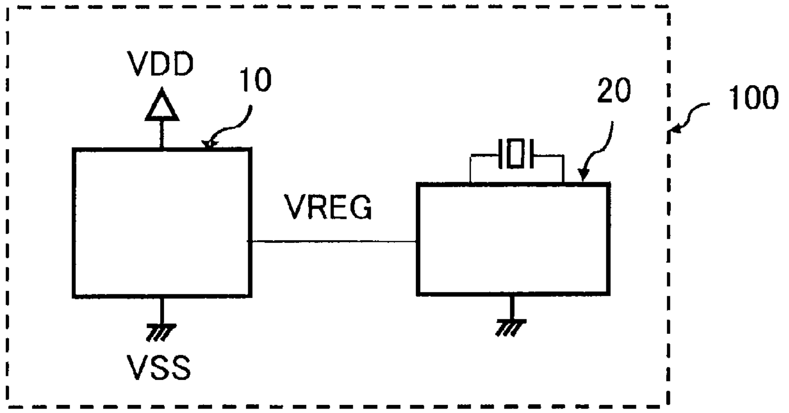
FIG. 1 is a schematic view showing an oscillation device of the present embodiment.

FIG. 1 is a schematic view showing an oscillation device of the present embodiment. An oscillation device 100 includes a constant voltage circuit 10 which generates a constant voltage, and a crystal oscillation circuit 20 which oscillates a crystal oscillator by the generated constant voltage.

Figure 2:
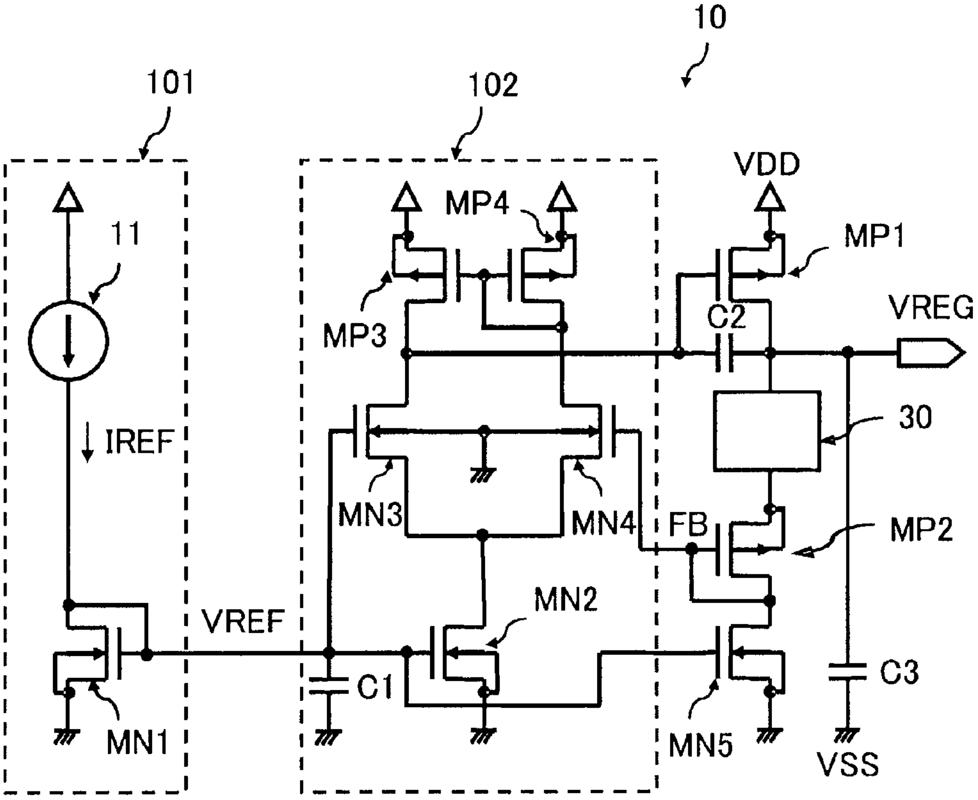
FIG. 2 is a circuit diagram showing an inner constitution of a constant voltage circuit of the oscillation device of the present embodiment.

FIG. 2 is a circuit diagram showing an inner constitution of the constant voltage circuit of the oscillation device of the present embodiment. The constant voltage circuit 10 comprises a reference voltage circuit 101, a differential amplification circuit 102, PMOS transistors MP1 and MP2, an NMOS transistor MN5, and a temperature characteristic regulation element 30.

The reference voltage circuit 101 is constituted of a constant current source 11 and an NMOS transistor MN1. A source of the NMOS transistor MN1 is grounded, and a gate of the transistor is connected to a drain of the transistor itself.

The differential amplification circuit 102 is constituted of an NMOS transistor MN2, a capacity C1, NMOS transistors MN3 and MN4 constituting a differential pair, and PMOS transistors MP3 and MP4 constituting a current mirror.

In the differential amplification circuit 102, a reference voltage VREF is input into a gate of the NMOS transistor MN3 which is an inversion input terminal, and a drain voltage of the NMOS transistor MN5, i.e., a feedback voltage FB is input into a gate of the NMOS transistor MN4 which is a non inversion input terminal. Through the NMOS transistor MN2 which constitutes the current mirror with the NMOS transistor MN1, a constant current IREF flows as an operation current. The capacity C1 stabilizes the reference voltage VREF.

A source of the PMOS transistor MP1 is connected to a power source terminal, a gate thereof is connected to a drain of the PMOS transistor MP3 which is an output of the differential amplification circuit 102, and a drain thereof is connected to an output terminal VREG of the constant voltage circuit 10. A source of the PMOS transistor MP2 is connected to the temperature characteristic regulation element 30, a gate thereof is connected to a drain of the transistor itself, and an input thereof is connected to the NMOS transistor MN4 which is the non inversion input terminal of the differential amplification circuit 102. The temperature characteristic regulation element 30 is connected across the drain of the PMOS transistor MP1 and the source of the PMOS transistor MP2. A gate of the NMOS transistor MN5 is connected to a gate and a drain of the NMOS transistor MN1, and a source thereof is grounded. The constant current IREF flows through the NMOS transistor MN5 constituting the current mirror with the NMOS transistor MN1. A capacity C2 is connected across the output of the differential amplification circuit 102 and the output terminal VREG. A capacity C3 is connected across the output terminal VREG and the ground. The capacity C2 is disposed as a phase compensation capacity, and the capacity C3 is disposed as a stabilization capacity of the constant voltage VREG.

Next, an operation of the constant voltage circuit of the oscillation device of the present embodiment will be described.

The reference voltage circuit 101 allows the constant current IREF to flow through the NMOS transistor MN1 from the constant current source 11 to generate the reference voltage VREF.

Since the output of the differential amplification circuit 102 is input into the gate of the PMOS transistor MP1, a drain current of the PMOS transistor MP1 is controlled so that the reference voltage VREF equals to the voltage FB. Therefore, the constant voltage VREG output from the drain of the PMOS transistor MP1 is a voltage obtained by adding up the reference voltage VREF, a source-drain voltage of the PMOS transistor MP2 and a voltage drop of the temperature characteristic regulation element 30.

Figure 3:
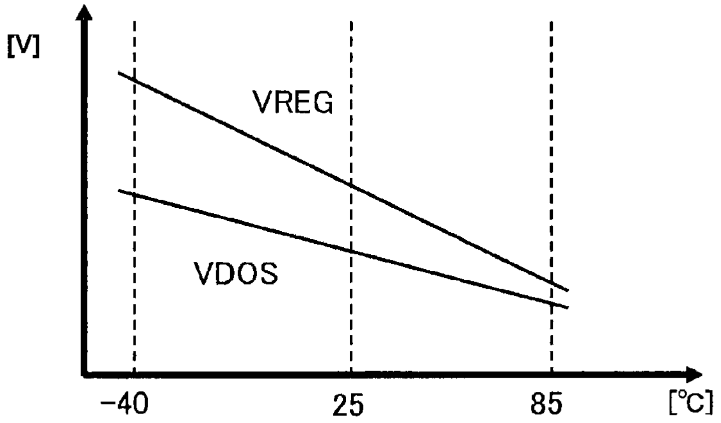
FIG. 3 is a schematic diagram showing temperature characteristics of the oscillation device.
Figure 3:
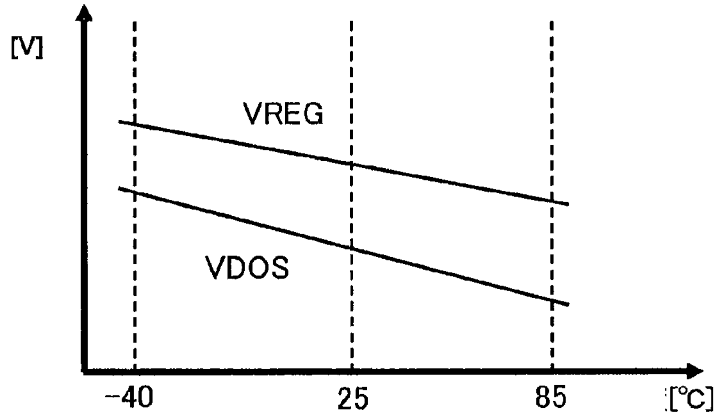
Figure 3:
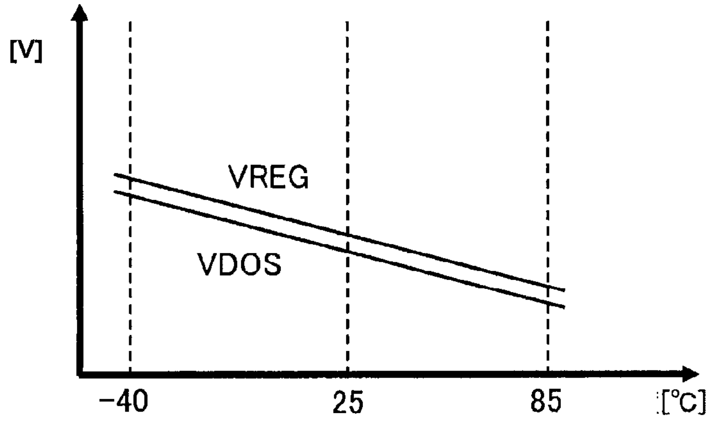

FIG. 3 is a schematic diagram showing temperature characteristics of the constant voltage circuit and the crystal oscillation circuit of the present embodiment.

An oscillation stop voltage VDOS of the crystal oscillation circuit 20 is determined by characteristics of the crystal oscillator, characteristics of an oscillation inverter, and a load capacity, and the voltage linearly drops with respect to a temperature change.

When the constant voltage VREG is smaller than the oscillation stop voltage VDOS, an oscillating operation of the crystal oscillation circuit 20 stops. Therefore, it is necessary to constantly set the constant voltage VREG to be not smaller than the oscillation stop voltage VDOS in an operation ensuring temperature range. Moreover, when the constant voltage VREG is excessively large, the consumption current of the crystal oscillation circuit 20 becomes high.

Therefore, to perform a constantly stable oscillating operation in the operation ensuring temperature range while realizing the low consumption current, the constant voltage VREG supplied from the constant voltage circuit 10 is requested to be constantly larger than the oscillation stop voltage VDOS of the crystal oscillation circuit 20, and a difference between the constant voltage VREG and the oscillation stop voltage VDOS is requested to be as small as possible.

Therefore, when voltage responses of the temperature characteristics of the constant voltage VREG and the oscillation stop voltage VDOS as shown by the slope of lines on an X-Y plot are the same and the difference between the voltages is small as shown in FIG. 3(*c*), the constantly stable operation can be performed in the operation ensuring temperature range.

Here, the temperature characteristics of the constant voltage VREG depend on a threshold voltage Vtnm of the NMOS transistor MN1, a threshold voltage Vtpm of the PMOS transistor MP2, the constant current IREF, and temperature characteristics of the temperature characteristic regulation element 30.

Figure 4:
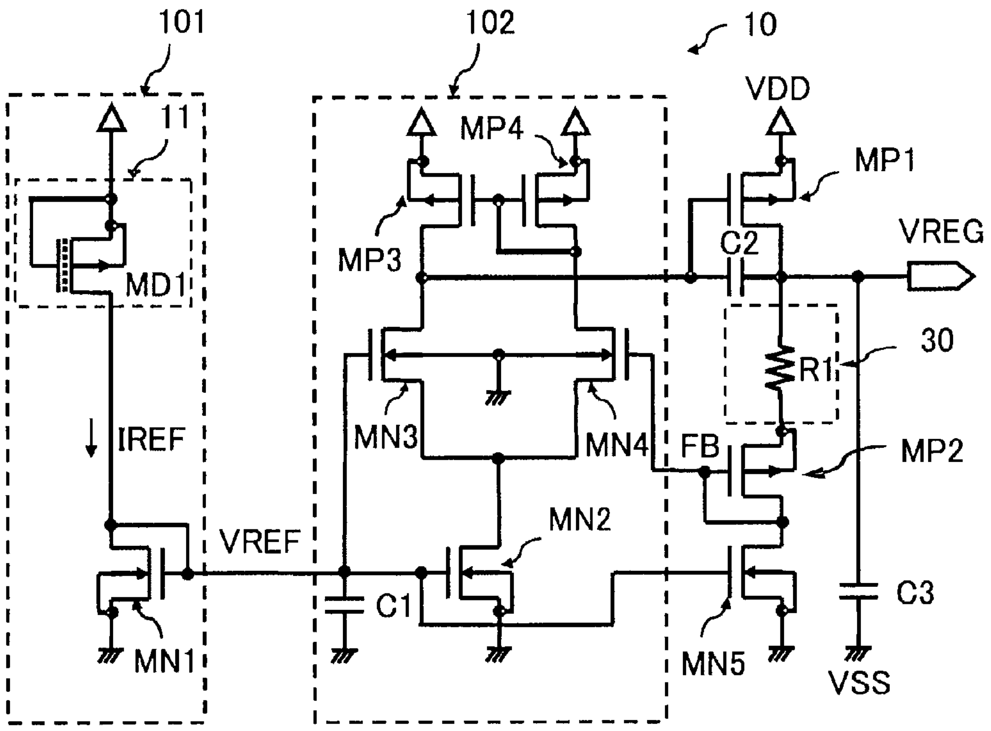
FIG. 4 is a circuit diagram showing one example of the constant voltage circuit of the oscillation device of the present embodiment.

The constant current source 11 of the constant voltage circuit of the present embodiment is constituted of a depletion type PMOS transistor MD1 as shown in FIG. 4. In the depletion type PMOS transistor MD1, a portion under a gate is doped with impurities of a high concentration. Therefore, even when a gate-source voltage Vgs is 0 V, a channel is already formed under the gate. Moreover, the depletion type PMOS transistor MD1 connects the gate and the source, and hence the transistor can constantly operate at the gate-source voltage Vgs=0 V irrespective of a power source voltage. In a saturated area, a drain-source current Ids=IREF hardly depends on the power source voltage. Therefore, the transistor can constitute a constant current source which can allow a constant current to flow even when the power source voltage varies.

Figure 5:
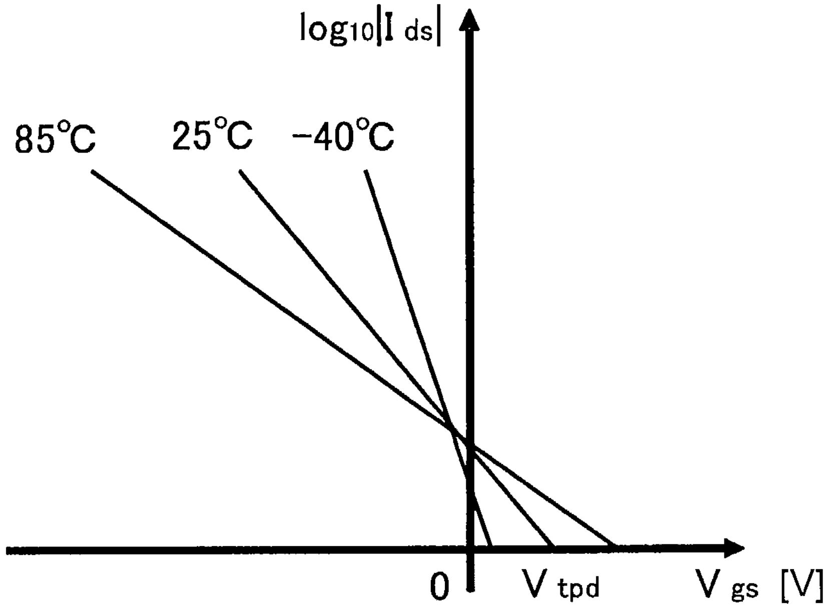
FIG. 5 is a schematic diagram showing temperature characteristics of a constant current source.

FIG. 5 is a schematic diagram showing temperature characteristics of the constant current source using the depletion type PMOS transistor.

A threshold voltage Vtpd of the depletion type PMOS transistor MD1 increases as the temperature rises. The depletion type PMOS transistor MD1 has the temperature characteristics that a voltage response (as shown by the slope of a line on an X-Y plot) of the drain-source current Ids decreases as the temperature rises.

Here, a drain-source current |Ids| to gate-source voltage Vgs curve of the depletion type PMOS transistor MD1 hardly moves at a certain point, even when the temperature changes. This point is known as a temperature characteristic flat point. When the threshold voltage Vtpd of the depletion type PMOS transistor MD1 is regulated so that the gate-source voltage Vgs=0 V comes to a point where the drain-source current Ids does not change owing to the temperature, i.e., the temperature characteristic flat point, it is possible to obtain the constant current source which does not depend on the temperature characteristics.

Moreover, when the threshold voltage Vtpd of the depletion type PMOS transistor MD1 is regulated so that the temperature characteristic flat point comes to a voltage region where the gate-source voltage Vgs is negative, the temperature characteristics of the constant current source, i.e., at the gate-source voltage Vgs=0 V are the characteristics that the drain-source current Ids=IREF increases as the temperature rises. Conversely, when the threshold voltage Vtpd of the depletion type PMOS transistor MD1 is regulated so that the temperature characteristic flat point comes to a voltage region where the gate-source voltage Vgs is positive, the temperature characteristics of the constant current source, i.e., at the gate-source voltage Vgs=0 V are the characteristics that the drain-source current Ids=IREF decreases as the temperature rises.

In this way, when the threshold voltage Vtpd of the depletion type PMOS transistor MD1 is regulated, it is possible to change the voltage response (as shown by the slope of a line on an X-Y plot) of the constant current IREF to the temperature change, and it is possible to regulate the voltage response of the constant voltage VREG which depends on the constant current IREF to the temperature change.

Therefore, the purpose of minimizing the difference between the voltage response of slope of the constant voltage VREG to the temperature change and the voltage response or slope of the oscillation stop voltage VDOS to the temperature change to decrease the consumption current of the crystal oscillation circuit 20 can be realized by regulating the threshold voltage Vtpd of the depletion type PMOS transistor MD1.

Here, it is considered that as a method of regulating the threshold voltage Vtpd of the depletion type PMOS transistor MD1 in accordance with the difference between the voltage response of the constant voltage VREG to the temperature change and the voltage response of the oscillation stop voltage VDOS to the temperature change, there are the following two cases.

When the voltage response or slope of the constant voltage VREG to the temperature change is steeper than the voltage response or slope of the oscillation stop voltage VDOS to the temperature change, the threshold voltage Vtpd of the depletion type PMOS transistor MD1 is regulated so that the temperature characteristic flat point comes to the negative voltage region. That is, when the voltage response or slope of the constant current IREF of the constant current source 11 to the temperature change is made to be positive, the voltage response or slope of the constant voltage VREG to the temperature change can be regulated.

Conversely, when the voltage response or slope of the constant voltage VREG to the temperature change is more gradual than the voltage response or slope of the oscillation stop voltage VDOS to the temperature change, the threshold voltage Vtpd of the depletion type PMOS transistor MD1 is regulated so that the temperature characteristic flat point comes to the positive voltage region. That is, when the voltage response or slope of the constant current source 11 to the temperature change is made to be negative, the voltage response or slope of the constant voltage VREG to the temperature change can be regulated.

Moreover, the temperature characteristic regulation element 30 of the constant voltage circuit of the present embodiment can be realized by a resistor R1 as shown in FIG. 4. When the resistor R1 is connected across the drain of the PMOS transistor MP1 and the source of the PMOS transistor MP2, the constant voltage VREG output from the drain of the PMOS transistor MP1 is set to a value obtained by adding up the reference voltage VREF, the source-drain voltage of the PMOS transistor MP2, and a voltage drop of the resistor R1.

The purpose of minimizing the difference between the slope of the constant voltage VREG to the temperature change and the slope of the oscillation stop voltage VDOS to the temperature change to decrease the consumption current of the crystal oscillation circuit 20 can be realized by regulating the slope of the resistor R1 to the temperature change.

Here, it is considered that as temperature characteristics of the resistor R1 which has the slope regulated in accordance with the difference between the slope of the constant voltage VREG to the temperature change and the slope of the oscillation stop voltage VDOS to the temperature change, there are the following two cases.

When the slope of the constant voltage VREG to the temperature change is steeper than the slope of the oscillation stop voltage VDOS to the temperature change, the slope of the resistor R1 to the temperature change is made to be positive. In consequence, the slope of the constant voltage VREG to the temperature change can be regulated in accordance with the slope of the oscillation stop voltage VDOS to the temperature change.

Conversely, when the slope of the constant voltage VREG to the temperature change is more gradual than the slope of the oscillation stop voltage VDOS to the temperature change, the slope of the resistor R1 to the temperature change is made to be negative. In consequence, the slope of the constant voltage VREG to the temperature change can be regulated in accordance with the slope of the oscillation stop voltage VDOS to the temperature change.

Figure 6:
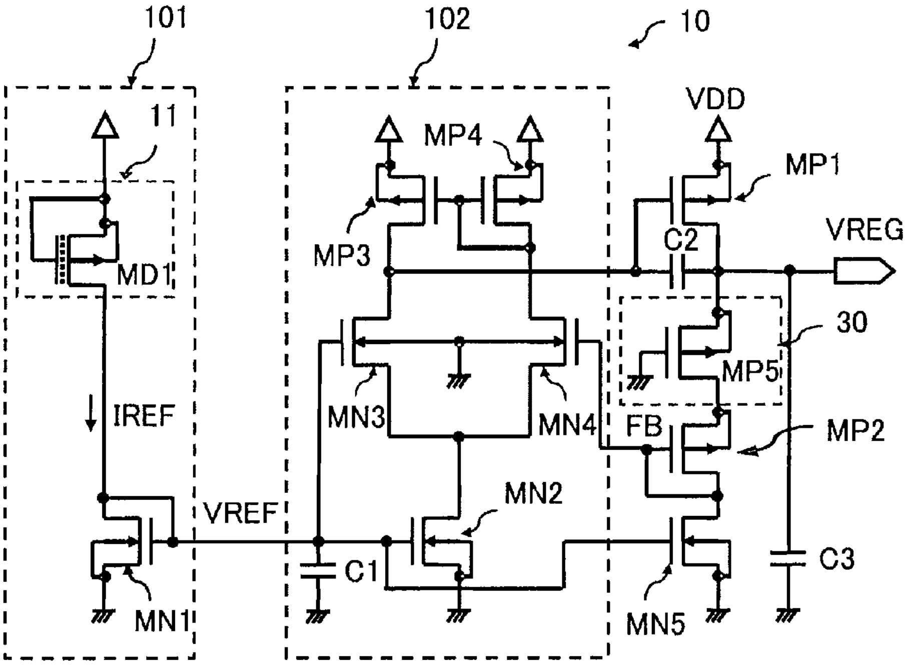
FIG. 6 is a circuit diagram showing another example of the constant voltage circuit of the oscillation device of the present embodiment.
Figure 7:
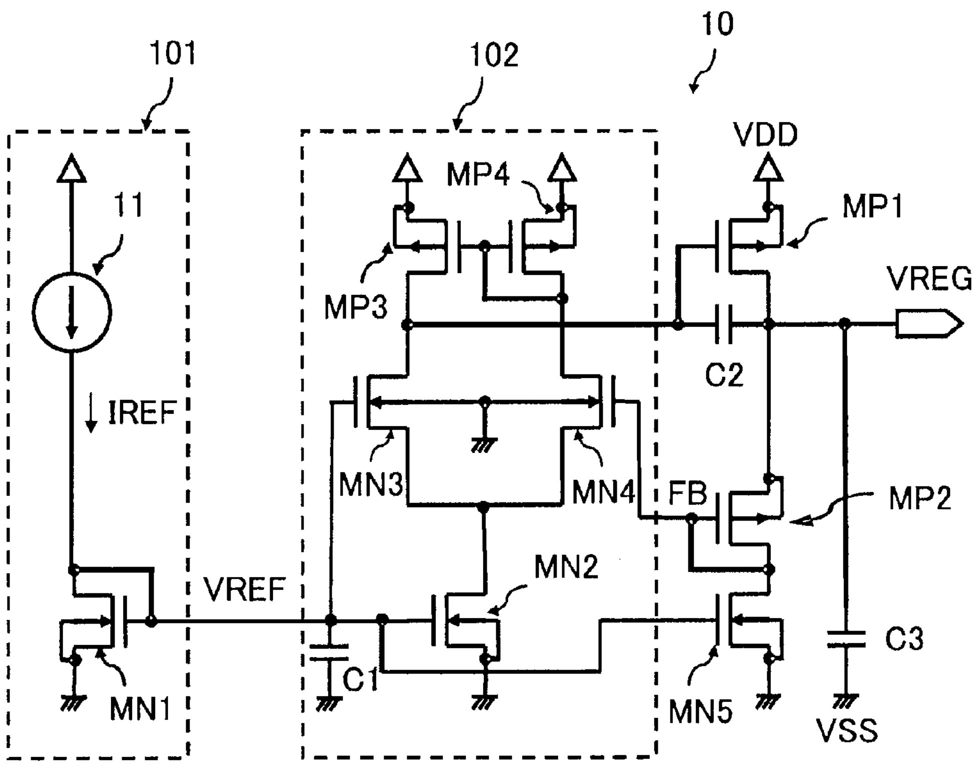
FIG. 7 PRIOR ART
FIG. 7 is a circuit diagram showing a constant voltage circuit of a conventional oscillation device.

Moreover, the temperature characteristic regulation element 30 of the constant voltage circuit of the present embodiment can be realized by a PMOS transistor MP5 as shown in FIG. 6. A source of the PMOS transistor MP5 is connected to the drain of the PMOS transistor MP1, a gate thereof is grounded, and a drain thereof is connected to the source of the PMOS transistor MP2.

When the gate of the PMOS transistor MP5 is grounded, the gate-source voltage Vgs becomes larger than the threshold voltage Vtpm, and the transistor can be brought to a constantly operable state. Moreover, when the PMOS transistor MP5 is set into a linear region, an on-resistance becomes dominant in the PMOS transistor MP5. That is, the PMOS transistor MP5 can be realized in place of the resistor R1.

It is known that the on-resistance of the PMOS transistor MP5 has a positive slope to the temperature change. Therefore, when the slope of the constant voltage VREG to the temperature change is steeper than the slope of the oscillation stop voltage VDOS to the temperature change, the slope of the constant voltage VREG to the temperature change can be regulated in accordance with the on-resistance having the positive temperature characteristics in the PMOS transistor MP5 having the grounded gate, to minimize the difference between the slope of the constant voltage VREG to the temperature change and the slope of the oscillation stop voltage VDOS to the temperature change.

In consequence, the constant voltage VREG constantly is not smaller than the oscillation stop voltage VDOS in the operation ensuring temperature range, the consumption current of the crystal oscillation circuit 20 can be decreased. Furthermore, the difference between the slope of the constant voltage VREG to the temperature change and the slope of the oscillation stop voltage VDOS to the temperature change does not have a tradeoff relation with the consumption current of the constant voltage circuit 10. Therefore, the constant current IREF of the constant voltage circuit 10 can be minimized, and the constant voltage circuit 10 can realize a low consumption current of several nAs. In consequence, the consumption current of the whole oscillation device 100 can be decreased.

The embodiments of the present invention have been described above, but the present invention is not limited to these embodiments, and can variously be embodied without departing from the scope of the present invention.

What is claimed is:

1. An oscillation device comprising a crystal oscillation circuit which is driven by a constant voltage output from a constant voltage circuit, the constant voltage circuit comprising:

a reference voltage circuit including a constant current source, and a first MOS transistor which outputs a reference voltage by a constant current of the constant current source;

a differential amplification circuit which inputs the reference voltage and a feedback voltage;

a second MOS transistor which outputs a constant voltage to an output terminal of the constant voltage circuit by an output of the differential amplification circuit;

a temperature characteristic regulation element having a first terminal connected to the output terminal and to an output of the second MOS transistor; and a third MOS transistor connected between a second terminal of the temperature characteristic regulation element and a ground connection to output the feedback voltage, wherein the constant voltage output from the constant voltage circuit has a first voltage response to a temperature change, an oscillation stop voltage of the crystal oscillation circuit has a second voltage response to the temperature change, a consumption current of the crystal oscillation circuit has a correlation with a difference between the first voltage response and the second voltage response, and the temperature characteristic regulation element regulates the first voltage response to minimize the difference between the first voltage response and the second voltage response.

2. The oscillation device according to claim 1, wherein the temperature characteristic regulation element comprises a resistor having positive or negative temperature characteristics.

3. The oscillation device according to claim 1, wherein the temperature characteristic regulation element comprises a fourth MOS transistor having positive or negative temperature characteristics.

4. The oscillation device according to claim 1, wherein the constant current source comprises a depletion type MOS transistor, and a threshold voltage of the depletion type MOS transistor is changed to regulate the first voltage response.

5. The oscillation device according to claim 1, wherein the second MOS transistor and the third MOS transistor comprise PMOS transistors.

* * * * *